(12) United States Patent
Endo et al.

(10) Patent No.: US 7,368,384 B2
(45) Date of Patent: May 6, 2008

(54) FILM FORMATION APPARATUS AND METHOD OF USING THE SAME

(75) Inventors: Atsushi Endo, Tokyo (JP); Tomonori Fujiwara, Tokyo (JP); Yuichiro Morozumi, Tokyo (JP); Katsushige Harada, Tokyo (JP); Shigeru Nakajima, Tokyo (JP); Dong-Kyun Choi, Tokyo (JP); Haruhiko Furuya, Tokyo (JP); Kazuo Yabe, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 348 days.

(21) Appl. No.: 11/110,931

(22) Filed: Apr. 21, 2005

(65) Prior Publication Data

US 2005/0245099 A1    Nov. 3, 2005

(30) Foreign Application Priority Data

Apr. 23, 2004  (JP)  ............................. 2004-127570
Mar. 16, 2005  (JP)  ............................. 2005-075048

(51) Int. Cl.
*H01L 21/302* (2006.01)

(52) U.S. Cl. ...................... 438/689; 438/680; 438/682; 438/710; 438/758; 438/784; 438/785; 438/900; 257/E21.219

(58) Field of Classification Search ...................... None
See application file for complete search history.

(56) References Cited

U.S. PATENT DOCUMENTS 6,095,158 A * 8/2000 Shugrue ........................ 134/1
6,164,295 A * 12/2000 Ui et al. ...................... 134/1.1

FOREIGN PATENT DOCUMENTS

JP           3-293726           12/1991

* cited by examiner

*Primary Examiner*—Michael Lebentritt
*Assistant Examiner*—Kyoung Lee
(74) *Attorney, Agent, or Firm*—Oblon, Spivak, McClelland, Maier & Neustadt, P.C.

(57) ABSTRACT

A method of using a film formation apparatus for a semiconductor process includes a step of removing a by-product film deposited on an inner surface of a reaction chamber of the film formation apparatus. This step is performed while supplying a cleaning gas containing hydrogen fluoride into the reaction chamber, and forming a first atmosphere within the reaction chamber, which allows water to be present as a liquid film.

13 Claims, 4 Drawing Sheets

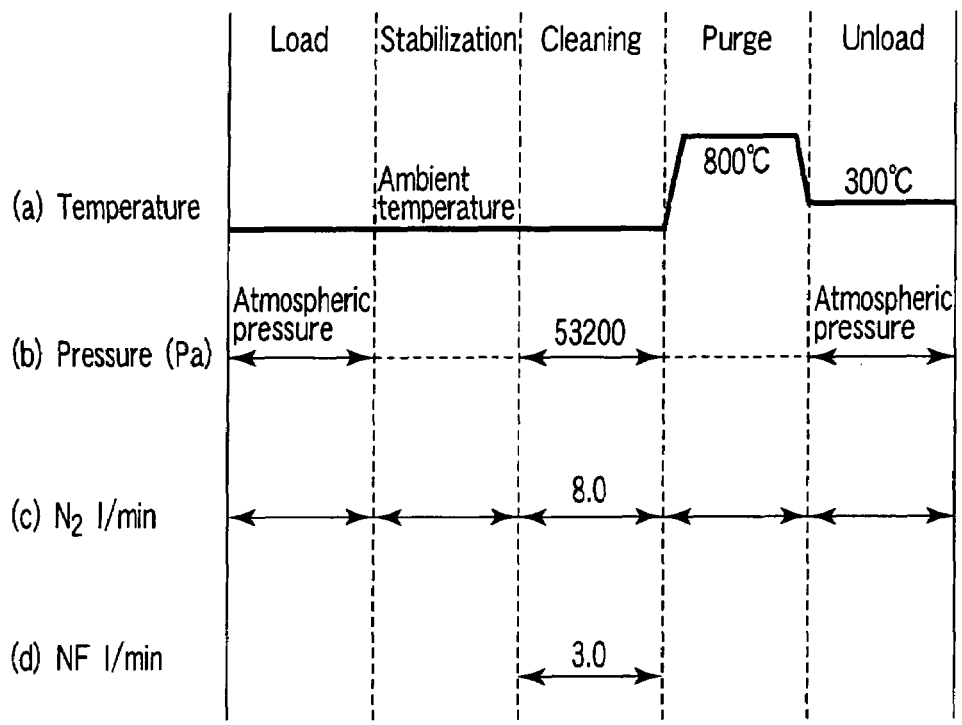
F I G. 3
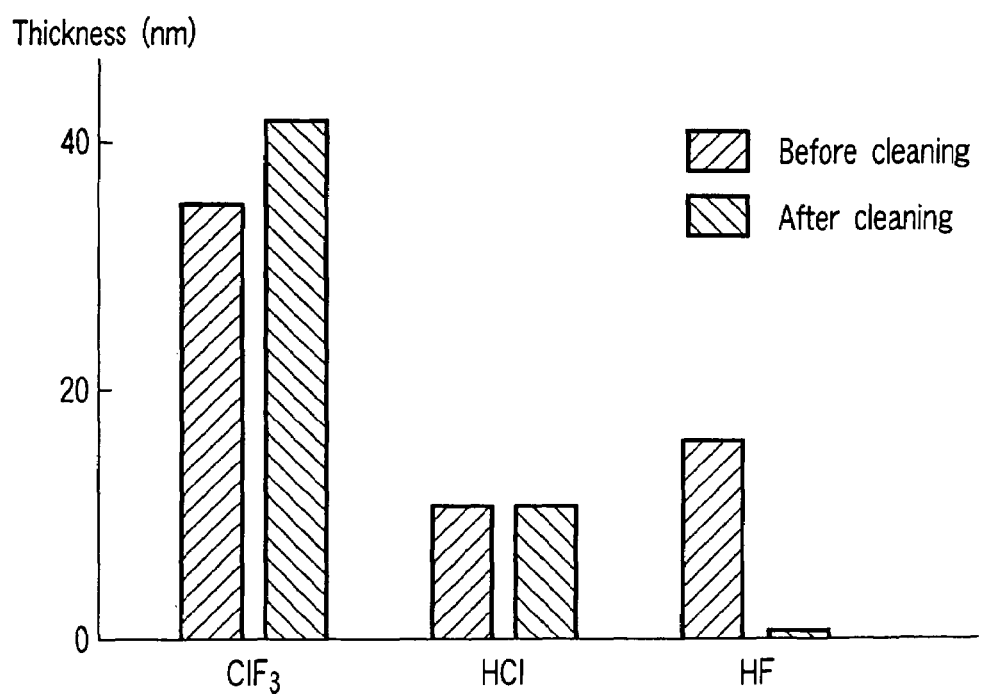
F I G. 4

FILM FORMATION APPARATUS AND METHOD OF USING THE SAME

CROSS-REFERENCE TO RELATED APPLICATIONS

This application is based upon and claims the benefit of priority from prior Japanese Patent Applications No. 2004-127570, filed Apr. 23, 2004; and No. 2005-075048, filed Mar. 16, 2005, the entire contents of both of which are incorporated herein by reference.

BACKGROUND OF THE INVENTION

1. Field of the Invention

The present invention relates to a film formation apparatus for a semiconductor process for forming a film on a target substrate, such as a semiconductor wafer, and also to a method of using the apparatus. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices, a process, such as CVD (Chemical Vapor Deposition), is performed to form a thin film, such as a silicon oxide film or silicon nitride film, on a target substrate, such as a semiconductor wafer. For example, a film formation process of this kind is arranged to form a thin film on a semiconductor wafer, as follows.

At first, the interior of the reaction tube (reaction chamber) of a heat-processing apparatus is heated by a heater at a predetermined load temperature, and a wafer boat that holds a plurality of semiconductor wafers is loaded. Then, the interior of the reaction tube is heated up to a predetermined process temperature, and gas inside the reaction tube is exhausted through an exhaust port, so that the pressure is inside the reaction tube is reduced to a predetermined pressure.

Then, while the interior of the reaction tube is kept at the predetermined temperature and pressure (kept exhausted), a film formation gas is supplied through a process gas feed line into the reaction tube. For example, in the case of CVD, when a film formation gas is supplied into a reaction tube, the film formation gas causes a thermal reaction and thereby produces reaction products. The reaction products are deposited on the surface of each semiconductor wafer, and form a thin film on the surface of the semiconductor wafer.

Reaction products generated during the film formation process are deposited (adhered) not only on the surface of the semiconductor wafer, but also on, e.g., the inner surface of the reaction tube and other members, the latter being as by-product films. If the film formation process is continued while by-product films are present on the interior of the reaction tube, some of the by-product films separate therefrom and generate particles. The particles may drop onto the semiconductor wafer, and reduce the yield of semiconductor devices to be fabricated.

In order to solve this problem, cleaning of the interior of the reaction tube is performed after the film formation process is repeated several times. In this cleaning, the interior of the reaction tube is heated at a predetermined temperature by a heater, and a cleaning gas, such as a mixture gas of fluorine and a halogen-containing acidic gas, is supplied into the reaction tube. The by-product films deposited on the inner surface of the reaction tube are thereby dry-etched and removed by the cleaning gas. Jpn. Pat. Appln. KOKAI Publication No. 3-293726 discloses a cleaning method of this kind. However, as described later, the present inventors have found that conventional cleaning methods of this kind may cause problems in that internal parts of the apparatus are deteriorated, or downtime of the apparatus is increased.

BRIEF SUMMARY OF THE INVENTION

An object of the present invention is to provide a film formation apparatus for a semiconductor process and a method of using the same, which can prevent internal parts of the apparatus from being deteriorated, and downtime of the apparatus from being increased.

According to a first aspect of the present invention, there is provided a method of using a film formation apparatus for a semiconductor process, the method comprising:

removing a by-product film deposited on an inner surface of a reaction chamber of the film formation apparatus, while supplying a cleaning gas containing hydrogen fluoride into the reaction chamber, and forming a first atmosphere within the reaction chamber, which allows water to be present as a liquid film.

According to a second aspect of the present invention, there is provided a film formation apparatus for a semiconductor process, comprising:

a reaction chamber configured to accommodate a target substrate;

a heater configured to heat an interior of the reaction chamber;

an exhaust system configured to exhaust the interior of the reaction chamber;

a film formation gas supply circuit configured to supply a film formation gas, for forming a product film on the target substrate, into the reaction chamber;

a cleaning gas supply circuit configured to supply a cleaning gas, which contains hydrogen fluoride for removing a by-product film derived from the film formation gas, into the reaction chamber; and a control section configured to control an operation of the apparatus, wherein the control section executes removing the by-product film deposited on the inner surface of the reaction chamber, while supplying the cleaning gas containing hydrogen fluoride into the reaction chamber, and forming a first atmosphere within the reaction chamber, which allows water to be present as a liquid film.

According to a third aspect of the present invention, there is provided a computer readable medium containing program instructions for execution on a processor, which, when executed by the processor, cause a film-formation apparatus for a semiconductor process to execute removing a by-product film deposited on an inner surface of a reaction chamber of the film formation apparatus, while supplying a cleaning gas containing hydrogen fluoride into the reaction chamber, and forming a first atmosphere within the reaction chamber, which allows water to be present as a liquid film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a view showing the recipe of a cleaning process according to an embodiment of the present invention;

FIG. 4 is a graph showing the thickness of an aluminum oxide film before and after cleaning, obtained by Experiment 1;

DETAILED DESCRIPTION OF THE INVENTION

Figure 1:
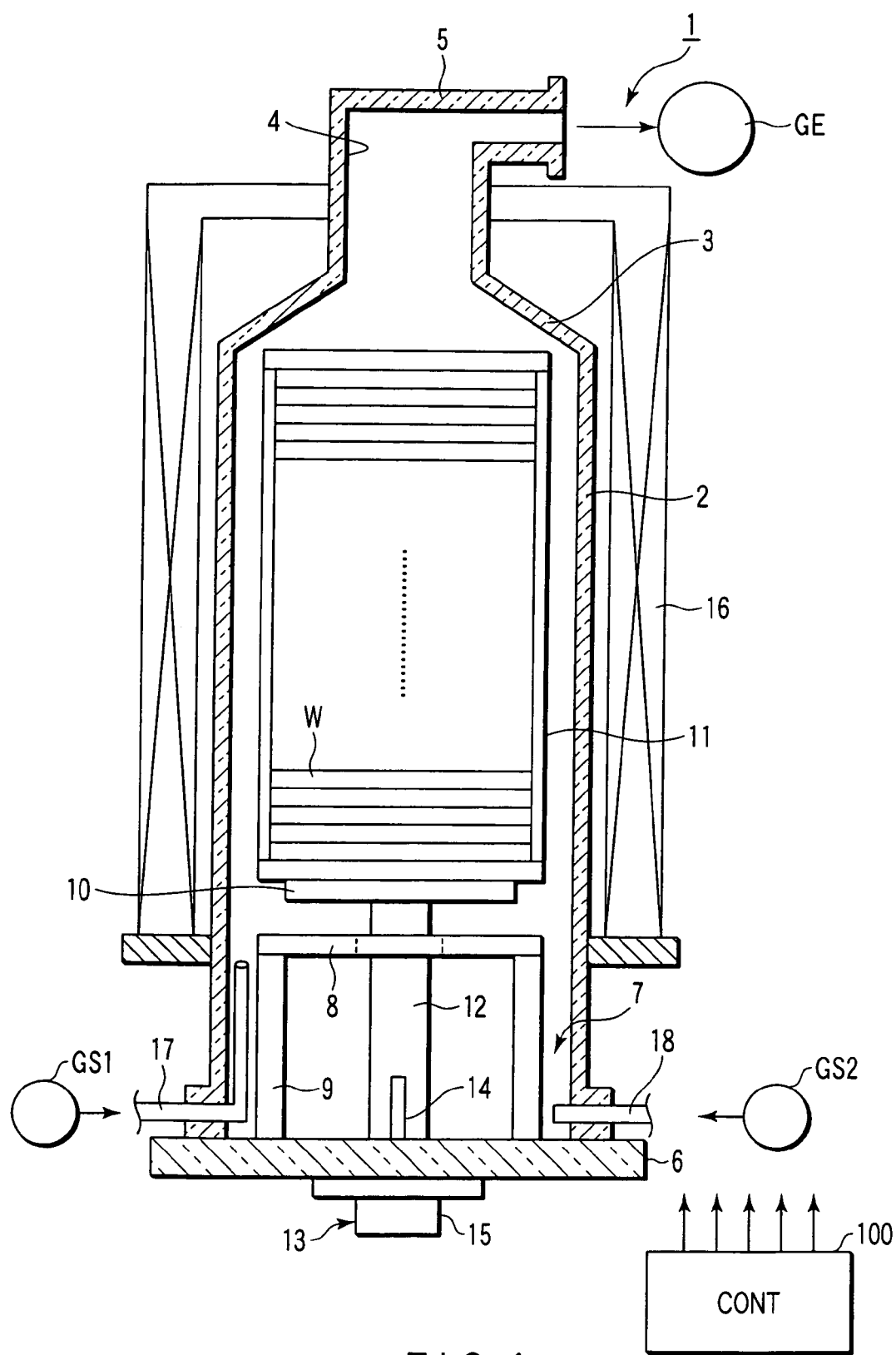
FIG. 1 is a view showing a vertical heat-processing apparatus according to an embodiment of the present invention.

In the process of developing the present invention, the inventors studied problems with regard to conventional methods for cleaning the interior of a reaction tube used in a film formation apparatus for a semiconductor process. As a result, the inventors have arrived at the findings given below.

Specifically, in order to remove by-product films deposited inside a reaction tube while supplying a cleaning gas, it is necessary to heat up the interior of the reaction tube. For example, where a by-product film consists of a compound with a low vapor pressure, the interior of the reaction tube needs to be heated up to a high temperature, so that the compound can be allocated with a sufficiently high vapor pressure. However, when a cleaning gas is supplied into the reaction tube heated at a high temperature, the material of the reaction tube, such as quartz, is damaged, thereby shortening the service life of the reaction tube. Further, corrosion of metal members used for an exhaust line and process gas feed line may be accelerated. In this way, when by-product films are removed, internal parts of the apparatus may be deteriorated.

In order to solve this problem, a hydrogen fluoride (HF) solution, for example, may be used to clean the reaction tube. In this case, by-product films are removed by wet etching. However, this wet etching requires work operations for detaching the reaction tube, manually cleaning the tube, and then reattaching and adjusting the tube. Further, the heat-processing apparatus needs to be shut down for a long time, thereby increasing downtime of the apparatus and lowering the operating rate thereof.

Embodiments of the present invention achieved on the basis of the findings given above will now be described with reference to the accompanying drawings. In the following description, the constituent elements having substantially the same function and arrangement are denoted by the same reference numerals, and a repetitive description will be made only when necessary.

FIG. 1 is a view showing a vertical heat-processing apparatus according to an embodiment of the present invention. As shown in FIG. 1, the heat-processing apparatus 1 includes an essentially cylindrical reaction tube (reaction chamber) 2 whose longitudinal direction is set in the vertical direction. The reaction tube 2 is made of a heat-resistant and corrosion-resistant material, such as quartz.

The top of the reaction tube 2 is formed as an essentially conical ceiling 3 whose diameter decreases toward the top. The ceiling 3 has an exhaust port 4 formed at the center, for exhausting gas inside the reaction tube 2. The exhaust port 4 is connected to an exhaust section GE through an airtight exhaust line 5. The exhaust section GE has a pressure adjusting mechanism including, e.g., a valve and a vacuum exhaust pump. The exhaust section GE is used to exhaust the atmosphere within the reaction tube 2, and set it at a predetermined pressure (vacuum level).

A lid 6 is disposed below the reaction tube 2. The lid 6 is made of a heat-resistant and corrosion-resistant material, such as quartz. The lid 6 is moved up and down by a boat elevator described later (not shown in FIG. 1, but shown in FIG. 2 with a reference symbol 128). When the lid 6 is moved up by the boat elevator, the bottom of the reaction tube 2 (load port) is closed. When the lid 6 is moved down by the boat elevator, the bottom of the reaction tube 2 (load port) is opened.

A thermally insulating cylinder 7 is disposed on the lid 6. The thermally insulating cylinder 7 is provided with a planar heater 8 made of a resistive heating body to prevent the temperature inside the reaction tube from decreasing due to heat radiation from the load port of the reaction tube 2. The heater 8 is supported at a predetermined height level relative to the top face of the lid 6 by a cylindrical support 9.

A rotary table 10 is disposed above the thermally insulating cylinder 7. The rotary table 10 is used as a table for rotatably mounting thereon a wafer boat 11 that holds target substrates, such as semiconductor wafers W. Specifically, the rotary table 10 is connected to a rotary shaft 12 disposed therebelow. The rotary shaft 12 passes through the center of the heater 8 and is connected to a rotation mechanism 13 for rotating the rotary table 10.

The rotation mechanism 13 is mainly formed of a motor (not shown), and a rotation feeder 15 with an axle 14 that airtightly penetrates the lid 6 from below. The axle 14 is coupled to the rotary shaft 12 of the rotary table 10, to transmit the rotational force of the motor to the rotary table 10 through the rotary shaft 12. When the axle 14 is rotated by the motor of the rotation mechanism 13, the rotational force of the axle 14 is transmitted to the rotary shaft 12, and the rotary table 10 is rotated.

The wafer boat 11 is configured to hold a plurality of semiconductor wafers W at predetermined intervals in the vertical direction. The wafer boat 11 is made of a heat-resistant and corrosion-resistant material, such as quartz. Since the wafer boat 11 is mounted on the rotary table 10, the wafer boat 11 is rotated along with the rotary table 10, and thus the semiconductor wafers W held in the wafer boat 11 are rotated.

A heater 16 made of, e.g., a resistive heating body is disposed near the reaction tube 2 to surround the tube 2. The interior of the reaction tube 2 is heated by the heater 16, so that the semiconductor wafers W are heated up (increase in temperature) to a predetermined temperature.

Process gas feed lines 17 penetrate the sidewall of the reaction tube 2 near the bottom, and are used for supplying process gases (such as film formation gases and a cleaning gas) into the reaction tube 2. Each process gas feed line 17 is connected to a process gas supply source GS1 through a mass-flow controller (MFC) described later (not shown in FIG. 1, but shown in FIG. 2 with a reference symbol 125).

For example, trimethyl aluminum ($Al(CH_3)_3$) and $O_3$ are used as film formation gases to form an aluminum oxide film on the semiconductor wafers W. A gas containing hydrogen fluoride (HF), such as a mixture gas of hydrogen fluoride (HF) and an inactive gas for dilution, e.g., nitrogen ($N_2$), is used as a cleaning gas to remove by-product films (reaction products) deposited inside the reaction tube 2.

Although FIG. 1 shows only one process gas feed line 17, a plurality of process gas feed lines 17 are disposed in accordance with the type of gases to be supplied into the reaction tube 2, in this embodiment. Specifically, film formation gas feed lines and cleaning gas feed lines penetrate the sidewall of the reaction tube 2 near the bottom for supplying film formation gases and a cleaning gas into the reaction tube 2, respectively.

A purge gas supply line 18 also penetrates the sidewall of the reaction tube 2 near the bottom. The purge gas supply line 18 is connected to a purge gas supply source GS2 through an MFC described later (not shown in FIG. 1, but shown in FIG. 2 with a reference symbol 125). The purge gas consists of an inactive gas, such as nitrogen gas.

Figure 2:
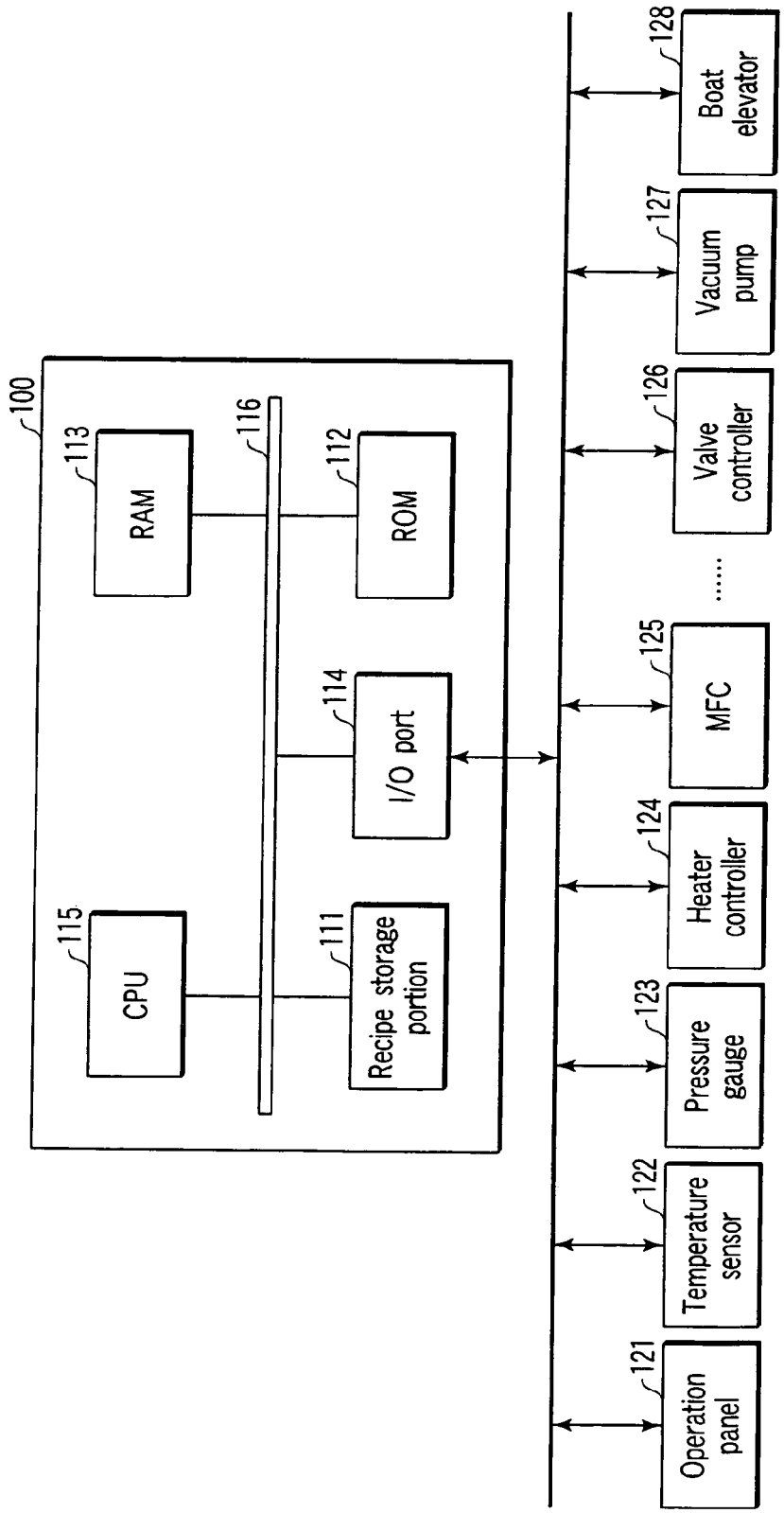
FIG. 2 is a view showing the structure of the control section of the apparatus shown in FIG. 1.

The heat-processing apparatus 1 further includes a control section 100 for controlling respective portions of the apparatus. FIG. 2 is a view showing the structure of the control section 100. As shown in FIG. 2, the control section 100 is connected to an operation panel 121, (a group of) temperature sensors 122, (a group of) pressure gages 123, a heater controller 124, MFCs 125, valve controllers 126, a vacuum pump 127, a boat elevator 128, and so forth.

The operation panel 121 includes a display screen and operation buttons, and is configured to transmit operator's instructions to the control section 100, and show various data transmitted from the control section 100 on the display screen. Temperature sensors 122 are configured to measure the temperature at respective portions inside the reaction tube 2 and exhaust line 5, and transmit measurement values to the control section 100. The pressure gages 123 are configured to measure the pressure at respective portions inside the reaction tube 2 and exhaust line 5, and transmit measurement values to the control section 100.

The heater controller 124 is configured to control the heater 8 and heater 16. The heater controller 124 turns on the heater 8 and heater 16 to generate heat, in accordance with instructions from the control section 100. The heater controller 124 is also configured to measure the power consumption of the heater 8 and heater 16, and transmit it to the control section 100.

The MFCs 125 are respectively disposed on piping lines, such as the process gas feed lines 17 and purge gas supply line 1. Each MFC 125 is configured to control the flow rate of a gas flowing through the corresponding line in accordance with instructed values received from the control section 100. Further, each MFC 125 is configured to measure the flow rate of a gas actually flowing, and transmit the reading to the control section 100.

The valve controllers 126 are respectively disposed on piping lines and configured to control the opening rate of valves disposed on piping lines, in accordance with instructed values received from the control section 100. The vacuum pump 127 is connected to the exhaust line 5 and configured to exhaust gas inside the reaction tube 2.

The boat elevator 128 is configured to move up the lid 6, so as to load the wafer boat 11 (semiconductor wafers W) placed on the rotary table 10 into the reaction tube 2. The boat elevator 128 is also configured to move the lid 6 down, so as to unload the wafer boat 11 (semiconductor wafers W) placed on the rotary table 10 from the reaction tube 2.

The control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the heat-processing apparatus 1 is manufactured, only the setup recipe is initially stored. The setup recipe is executed when a thermal model or the like for a specific heat-processing apparatus is formed. The process recipes are prepared respectively for heat processes to be actually performed by a user. Each process recipe prescribes temperature changes at respective portions, pressure changes inside the reaction tube 2, start/stop timing for supply of process gases, and supply rates of process gases, from the time semiconductor wafers W are loaded into the reaction tube 2 to the time processed wafers W are unloaded.

The ROM 112 is a recording medium formed of an EEPROM, flash memory, or hard disc, and is used to store operation programs executed by the CPU 115 or the like. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, and boat elevator 128, and is configured to control output/input of data or signals.

The CPU (Central Processing Unit) 115 is the hub of the control section 100. The CPU 115 is configured to run control programs stored in the ROM 112, and control an operation of the heat-processing apparatus 1, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the reaction tube 2 and exhaust line 5. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a method of using the heat-processing apparatus 1 described above. Specifically, at first, an aluminum oxide film ($Al_2O_3$ film) is formed as a product film by CVD on semiconductor wafers W within the reaction tube 2. At this time, by-product films containing aluminum oxide as the main component (it means 50% or more) are deposited on the inner surface of the reaction tube 2 and so forth. Then, the wafers W are unloaded, and a cleaning process for the interior of the reaction tube 2 is performed, as follows. FIG. 3 is a view showing the recipe of a cleaning process according to an embodiment of the present invention.

The respective components of the heat-processing apparatus described below 1 are operated under the control of the control section 100 (CPU 115). The temperature and pressure inside the reaction tube 2 and the gas flow rates during the process are set in accordance with the recipe shown in FIG. 3, while the control section 100 (CPU 115) controls the heater controller 124 (for the heaters 8 and 16), MFCs 125 (on the process gas feed lines 17 and purge gas supply line 18), valve controllers 126, and vacuum pump 127, as described above.

At first, the interior of the reaction tube 2 is set at a predetermined load temperature, such as an ambient temperature (e.g., 25° C.), as shown in FIG. 3, (a). Further, nitrogen gas is supplied through the purge gas supply line 18 into the reaction tube 2 at a predetermined flow rate, as shown in FIG. 3, (c). Then, an empty wafer boat 11 that holds no semiconductor wafers W is placed on the lid 6, and the lid 6 is moved up by the boat elevator 128. As a consequence, the wafer boat 11 is loaded into the reaction tube 2 and the reaction tube 2 is airtightly closed (load step).

Then, a predetermined cleaning atmosphere is formed within the reaction tube 2. The cleaning atmosphere is set to allow water ($H_2O$) to be present as a liquid film inside the reaction tube 2. A cleaning process described later is performed under this atmosphere, and a cleaning gas (hydrogen fluoride) reacts with by-product films (containing aluminum oxide as the main component), thereby generating water, which forms a liquid film on the inner surface of the reaction tube 2 and so forth. The water further reacts with intermediate products generated from the by-product films during the cleaning process, thereby promoting removal of the by-product films.

In order to form such a cleaning atmosphere, the interior of the reaction tube 2 is maintained at a predetermined temperature within a range of, e.g., from 0 to 100° C., such as an ambient temperature (25° C.) in this example, as shown in FIG. 3, (a). Further, nitrogen gas is supplied through the purge gas supply line 18 into the reaction tube 2 at a predetermined flow rate, while gas inside the reaction tube 2 is exhausted. By doing so, the interior of the reaction tube 2 is set at a predetermined pressure within a range of, e.g., from 13,300 Pa (100 Torr) to atmospheric pressure, such as 53,200 Pa (400 Torr) in this example, as shown in FIG. 3, (b). This temperature and pressure control is kept performed until the reaction tube 2 is stabilized at the predetermined pressure and temperature (stabilization step).

When the interior of the reaction tube 2 is stabilized at the predetermined pressure and temperature, a cleaning gas containing hydrogen fluoride (HF) is supplied through the corresponding process gas feed line 17 into the reaction tube 2. The cleaning gas contains hydrogen fluoride (HF) supplied at a predetermined flow rate, such as 3 liters/min, as shown in FIG. 3, (d), and nitrogen supplied at a predetermined flow rate, such as 8 liters/min, as shown in FIG. 3, (c).

When the cleaning gas supplied into the reaction tube 2, hydrogen fluoride in the cleaning gas reacts with by-product films (containing aluminum oxide as the main component) deposited on the inner surface of the reaction tube 2 and so forth, and intermediate products and water are thereby generated. Since the cleaning atmosphere described above is formed within the reaction tube 2, the generated water forms a liquid film on the inner surface of the reaction tube 2 and so forth. The water further reacts with generated intermediate products to generate water-soluble. intermediate products and so forth. The water-soluble intermediate products are dissolved in water and thereby dissociated from the inner surface of the reaction tube 2 and so forth. In this way, by-product films deposited on the inner surface of the reaction tube 2 and so forth are removed (cleaning step).

In this cleaning step, the temperature inside the reaction tube 2 is set to be as low as that which allows water to be present as a liquid film inside the reaction tube 2. Accordingly, parts of the heat-processing apparatus 1, such as the reaction tube 2, are prevented from being deteriorated during the cleaning step.

After the cleaning step is performed for a predetermined time, the supply of the cleaning gas through the process gas feed line 17 is stopped. Then, gas inside the reaction tube 2 is exhausted, and nitrogen is supplied through the purge gas supply line 18 at a predetermined flow rate, as shown in FIG. 3, (c), to exhaust gas from the reaction tube 2 to the exhaust line 5 (purge step). It is preferable to repeat the gas exhaust and nitrogen gas supply for the interior of the process tube 2 a plurality of times, in order to reliably exhaust the gas inside the process tube 2.

Further, in the purge step, the interior of the reaction tube 2 is heated by the heater 16 to a predetermined high temperature of, e.g., from 500 to 950° C., such as 800° C. in this example, as shown in FIG. 3, (a). As a consequence, water inside the reaction tube 2 is completely vaporized and reliably removed. At this time, although the interior of the reaction tube 2 is heated to a high temperature, since no cleaning gas (hydrogen fluoride) is supplied into the reaction tube 2, parts of the heat-processing apparatus 1, such as the reaction tube 2, are prevented from being deteriorated.

Then, the interior of the reaction tube 2 is set by the heater 16 at a predetermined temperature, such as 300° C., as shown in FIG. 3, (a). Further, nitrogen gas is supplied through the purge gas supply line 18 into the reaction tube 2 at a predetermined flow rate, as shown in FIG. 3, (c). The pressure inside the process tube 2 is thus returned to atmospheric pressure, as shown in FIG. 3, (b). Then, the lid 6 is moved down by the boat elevator 128, and the wafer boat 11 is thereby unloaded (unload step).

As the process described above is being performed, by-product films deposited on the inner surface of the reaction tube 2 and the surface of the wafer boat 11 are removed. Thereafter, a wafer boat 11 with a new lot of semiconductor wafers W mounted thereon is placed on the lid 6, and the film formation process is started again in the manner described above.

<Experiment 1>

An experiment was conducted to examine whether the process described above would remove by-product films deposited on the inner surface of the reaction tube 2 and so forth. Specifically, in a present example 1, semiconductor wafers W each with an aluminum oxide film formed thereon and having a predetermined thickness were mounted on the wafer boat 11. The wafer boat 11 was loaded into the reaction tube 2, and subjected to cleaning in accordance with the recipe shown in FIG. 3. In a comparative example 1, using HCl as a cleaning gas in place of hydrogen fluoride, the same process was performed except that the temperature and pressure for the cleaning step were set at 700° C. and atmospheric pressure, respectively. In a comparative example 2, using $ClF_3$ as a cleaning gas in place of hydrogen fluoride, the same process was performed except that the temperature and pressure for the cleaning step were set at 400° C. and 66.5 Pa (0.5 Torr), respectively. The thickness of the aluminum oxide film was measured by XRF (fluorescent X-ray analysis), before and after cleaning, in the present example 1 and comparative examples 1 and 2.

FIG. 4 is a graph showing the thickness of the aluminum oxide film before and after cleaning, obtained by Experiment 1. As shown in FIG. 4, the present example 1 (which employed a gas containing hydrogen fluoride as a cleaning gas) showed the thickness of the aluminum oxide film being reduced to 1/10 or less. On the other hand, the comparative examples 1 and 2 (which respectively employed HCl and $ClF_3$ as a cleaning gas) did not show the thickness of the aluminum oxide film being reduced, although the temperature inside the reaction tube 2 for the cleaning step was set higher.

Based on the results of Experiment 1, it has been confirmed that use of a gas containing hydrogen fluoride as a cleaning gas is effective in removing by-product films containing aluminum oxide as the main component and deposited on the inner surface of the reaction tube 2 and so forth. Further, since the cleaning step is performed at an ambient temperature, parts of the heat-processing apparatus 1, such as the reaction tube 2, are prevented from being deteriorated during the cleaning step.

<Experiment 2>

In a present example 2, semiconductor wafers W each with a multi-layered film of aluminum oxide and tantalum oxide ($Al_2O_3/Ta_2O_5$) formed thereon and having a predetermined thickness were mounted on the wafer boat 11. The wafer boat 11 was loaded into the reaction tube 2, and subjected to cleaning in accordance with the recipe shown in FIG. 3. In a present example 3, semiconductor wafers W each with a tantalum oxide ($Ta_2O_5$) film formed thereon and having a predetermined thickness were mounted on the wafer boat 11. The wafer boat 11 was loaded into the reaction tube 2, and subjected to cleaning in accordance with the recipe shown in FIG. 3. The thickness of the $Al_2O_3/Ta_2O_5$ multi-layered film and tantalum oxide film was measured by XRF, before and after cleaning, in the present examples 2 and 3.

Figure 5:
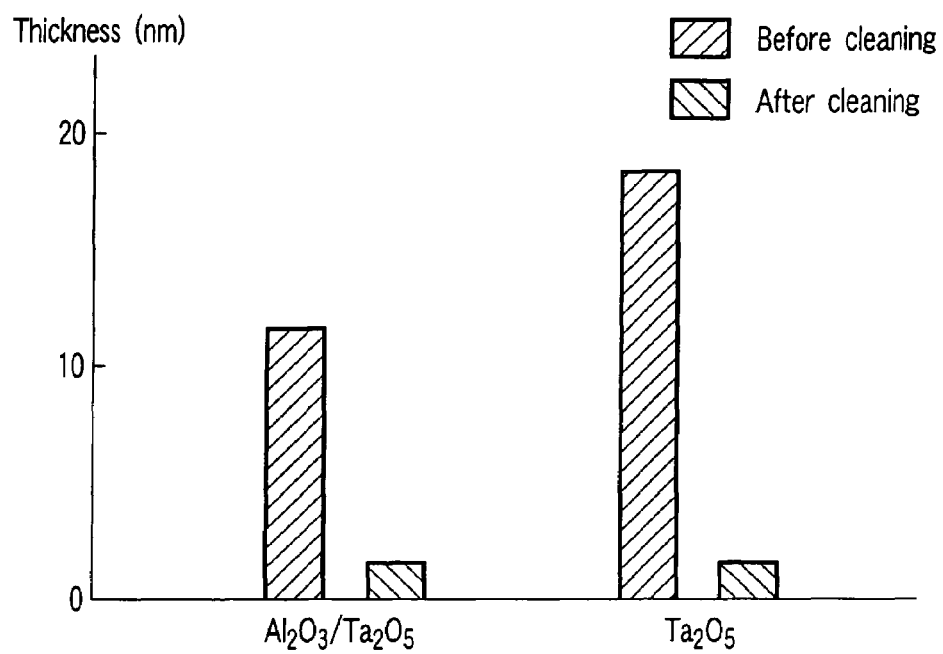
FIG. 5 is a graph showing the thickness of an $Al_2O_3$/$Ta_2O_5$ multi-layered film and a tantalum oxide film before and after cleaning, obtained by Experiment 2.

FIG. 5 is a graph showing the thickness of the $Al_2O_3/Ta_2O_5$ multi-layered film and tantalum oxide film before and after cleaning, obtained by Experiment 2. As shown in FIG. 5, the present examples 2 and 3 (which respectively removed the $Al_2O_3/Ta_2O_5$ multi-layered film and tantalum oxide film by cleaning) showed the film thickness being reduced to $1/7$ to $1/10$ or less.

Based on the results of Experiment 2, it has been confirmed that use of a gas containing hydrogen fluoride as a cleaning gas is effective in removing by-product films containing $Al_2O_3/Ta_2O_5$ or tantalum oxide as the main component and deposited on the inner surface of the reaction tube 2 and so forth. Further, since the cleaning step is performed at an ambient temperature, parts of the heat-processing apparatus 1, such as the reaction tube 2, are prevented from being deteriorated during the cleaning step.

<Experiment 3>

In a present example 4, semiconductor wafers W each with an HfSiON film formed thereon and having a predetermined thickness were mounted on the wafer boat 11. The wafer boat 11 was loaded into the reaction tube 2, and subjected to cleaning in accordance with the recipe shown in FIG. 3. In a present example 5, semiconductor wafers W each with an HfSiO film formed thereon and having a predetermined thickness were mounted on the wafer boat 11. The wafer boat 11 was loaded into the reaction tube 2, and subjected to cleaning in accordance with the recipe shown in FIG. 3. The thickness of the HfSiON film and HfSiO film was measured by XRF, before and after cleaning, in the present examples 4 and 5.

Figure 6:
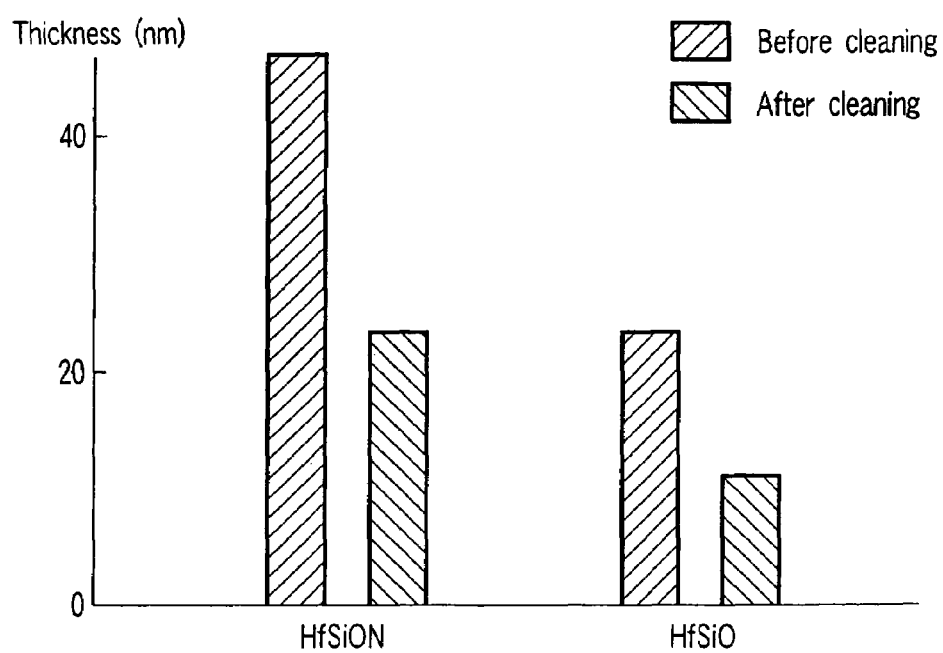
FIG. 6 is a graph showing the thickness of an HfSiON film and an HfSiO film before and after cleaning, obtained by Experiment 3.

FIG. 6 is a graph showing the thickness of the HfSiON film and HfSiO film before and after cleaning, obtained by Experiment 3. As shown in FIG. 6, the present examples 4 and 5 (which respectively removed the HfSiON film and HfSiO film by cleaning) showed the film thickness being reduced to $1/2$ or less.

Based on the results of Experiment 3, it has been confirmed that use of a gas containing hydrogen fluoride as a cleaning gas is effective in removing by-product films containing HfSiON or HfSiO as the main component and deposited on the inner surface of the reaction tube 2 and so forth. Further, since the cleaning step is performed at an ambient temperature, parts of the heat-processing apparatus 1, such as the reaction tube 2, are prevented from being deteriorated during the cleaning step.

The present invention is not limited to the embodiment described above, and it may be modified or applied in various manners. Next, an explanation will be given of other possible embodiments of the present invention.

In Experiments 1 to 3 described above, a process was performed to remove a film containing, as the main component, $Al_2O_3$, $Ta_2O_5$, $Al_2O_3/Ta_2O_5$ multi-layered film, HfSiON, or HfSiO. However, the present invention may be applied to a case where a by-product film contains another substance as the main component, such as HfSiOx, $HfO_2$, TEOS, SiN, SiC, SiOC, SiCN, $Nb_2O_5$, BSTO ($BaSrTiO_3$), STO ($SrTiO_3$), or AlHfO. Particularly, the present invention is preferably applied to a case where a by-product film contains a compound with a low vapor pressure as the main component. It should be noted that a by-product film is not limited to the same component as a product film formed on a wafer, and it may contain various reaction products or reaction by-products generated in the process of forming a product film.

In the embodiment described above, an explanation is given of a reaction between by-product films and a cleaning gas (hydrogen fluoride) in the cleaning process, taking as an example a case where the by-product films contain $Al_2O_3$ as the main component. As in this case, where a by-product film contains an oxide as the main component, water is generated by a reaction between the oxide and hydrogen fluoride in the cleaning step for removing the by-product film. However, even where a by-product film contains no oxide, such as one consisting of nitride, it is possible to perform the same cleaning by additionally supplying water. For example, in the cleaning step for removing the by-product film, water is supplied into the reaction tube 2, along with a cleaning gas.

In the embodiment described above, the cleaning step is exemplified by a case where the pressure inside the reaction tube 2 is set at 53,200 Pa (400 Torr). However, the pressure inside the reaction tube 2 may be set at a predetermined pressure ranging from 13,300 Pa (100 Torr) to atmospheric pressure. Further, as regards frequency, the cleaning may be performed after several film formation processes, or each individual film formation process.

In the embodiment described above, the purge step is exemplified by a case where the temperature inside the reaction tube 2 is set at 800° C. to remove water generated in the cleaning step. However, water generated in the cleaning step can be removed if an atmosphere that does not allow water to be present as a liquid film is formed inside the reaction tube 2 at a certain time after the cleaning step. For example, even if the temperature inside the reaction tube 2 is not set at 800° C. during the purge step, water inside the reaction tube 2 is removed when the temperature inside the reaction tube 2 reaches 300° C. before the unload step is carried out.

In the embodiment described above, the cleaning gas contains hydrogen fluoride and nitrogen gas used as a dilution gas. The cleaning gas preferably contains a dilution gas, because the process time can be more easily controlled if it is so arranged. However, the cleaning gas may contain no dilution gas. The dilution gas consists preferably of an inactive gas, such as helium gas (He), neon gas (Ne), or argon gas (Ar), other than nitrogen gas.

In the embodiment described above, the reaction tube 2, lid 6, and wafer boat 11 are made of quartz. Alternatively, these members may be made mainly of a material selected from other silicon-containing materials, such as silicon carbide (SiC). Further, the lid 6 may be made of stainless steel.

In the embodiment described above, the process gas feed lines 17 are disposed in accordance with the type of process steps. Alternatively, for example, a plurality of process gas feed lines 17 may be disposed in accordance with the type of gases (e.g., film formation gases, hydrogen fluoride, nitrogen, and so forth). Further, a plurality of process gas feed lines 17 may be connected to the sidewall of the reaction tube 2, e.g., near the bottom, to supply each gas through a plurality of lines. In this case, a process gas is supplied through the plurality of process gas feed lines 17 into the reaction tube 2, and thereby more uniformly spreads in the reaction tube 2.

In the embodiments described above, the heat-processing apparatus employed is a heat-processing apparatus of the batch type having a single-tube structure. However, for example, the present invention may be applied to a vertical heat-processing apparatus of the batch type having a reaction tube 2 of the double-tube type, which is formed of inner and outer tubes. Alternatively, the present invention may be applied to a heat-processing apparatus of the single-substrate type. The target substrate is not limited to a semiconductor wafer W, and it may be a glass substrate for, e.g., LCDs.

The control section 100 of the heat-processing apparatus is not limited to a specific system, and it may be realized by an ordinary computer system. For example, a program for executing the process described above may be installed into a multi-purpose computer, using a recording medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined recording medium, as described above. In this case, for example, a program may be pasted on a bulletin board (BBS) on a communication network, and then supplied through a network while being superimposed on a carrier wave. The program thus provided would then be activated and ran under the control of the OS of the computer, as in the other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of using a film formation apparatus for a semiconductor process, the method comprising:

removing a by-product film deposited on an inner surface of a reaction chamber of the film formation apparatus, while supplying a cleaning gas containing hydrogen fluoride into the reaction chamber, and forming a first atmosphere within the reaction chamber, which allows water to be present as a liquid film, wherein the method further comprises, after removing the by-product film, purging an interior of the reaction chamber while supplying an inactive gas into the reaction chamber; and forming a second atmosphere within the reaction chamber, which does not allow water to be present as a liquid film, an interior of the reaction chamber being set at a second temperature ranging from 500 to 950° C. to form the second atmosphere.

2. The method according to claim 1, wherein an interior of the reaction chamber is set at a first temperature ranging from 0 to 100° C. to form the first atmosphere.

3. The method according to claim 2, wherein the first temperature is an ambient temperature.

4. The method according to claim 1, wherein an interior of the reaction chamber is set at a first pressure ranging from 1300 Pa to atmospheric pressure to form the first atmosphere.

5. The method according to claim 1, wherein the by-product film contains an oxide as a main component, and the hydrogen fluoride reacts with the oxide to generate water in removing the by-product film.

6. The method according to claim 1, wherein water is supplied into the reaction chamber along with the cleaning gas in removing the by-product film.

7. The method according to claim 1, further comprising, before removing the by-product film, forming a product film on the target substrate by CVD within the reaction container, during which the by-product film is deposited on the inner surface of the reaction chamber.

8. The method according to claim 1, wherein the by-product film contains, as a main component, a substance selected from the group consisting of $Al_2O_3$, HfSiOx, $HfO_2$, TEOS, SiN, SiC, SiOC, SiCN, $Ta_2O_5$, $Nb_2O_5$, BSTO, STO, and AlHfO.

9. The method according to claim 2, wherein an interior of the reaction chamber is set at a first pressure ranging from 1300 Pa to atmospheric pressure to form the first atmosphere.

10. The method according to claim 9, further comprising, before removing the by-product film, forming a product film on the target substrate by CVD within the reaction container, during which the by-product film is deposited on the inner surface of the reaction chamber.

11. The method according to claim 10, wherein the by-product film contains, as a main component, a substance selected from the group consisting of $Al_2O_3$, HfSiOx, $HfO_2$, TEOS, SiN, SiC, SiOC, SiCN, $Ta_2O_5$, $Nb_2O_5$, BSTO, STO, and AlHfO.

12. The method according to claim 10, wherein the by-product film contains, as a main component, a substance selected from the group consisting of $Al_2O_3$, $Ta_2O_5$, $Al_2O_3$/$Ta_2O_5$ multi-layered film, HfSiON, and HfSiO.

13. The method according to claim 10, wherein the by-product film contains $Al_2O_3$ as a main component.

* * * * *